US008887136B2

(12) United States Patent
Delbaere et al.

(10) Patent No.: US 8,887,136 B2
(45) Date of Patent: Nov. 11, 2014

(54) CONTEXT-BASED EVALUATION OF EQUATIONS

(75) Inventors: Christian M. R. Delbaere, Ottawa (CA); Anil P. Balaram, Nepean (CA)

(73) Assignee: Synopsys, Inc., Mountain View, CA (US)

(*) Notice: Subject to any disclaimer, the term of this patent is extended or adjusted under 35 U.S.C. 154(b) by 759 days.

(21) Appl. No.: 12/773,429

(22) Filed: May 4, 2010

(65) Prior Publication Data

US 2011/0276947 A1 Nov. 10, 2011

(51) Int. Cl.
*G06F 9/44* (2006.01)
*G06F 17/50* (2006.01)
*G06F 17/10* (2006.01)

(52) U.S. Cl.
CPC ............ *G06F 17/5036* (2013.01); *G06F 17/10* (2013.01)
USPC ............................. 717/125; 717/126; 717/135

(58) Field of Classification Search
None
See application file for complete search history.

(56) References Cited

U.S. PATENT DOCUMENTS

| | | | | |
|---|---|---|---|---|
| 5,598,348 A * | 1/1997 | Rusu et al. | ..................... | 716/115 |
| 6,029,902 A * | 2/2000 | Hickey et al. | .................. | 717/125 |
| 6,266,804 B1 * | 7/2001 | Isman | ............................ | 717/125 |
| 6,591,402 B1 * | 7/2003 | Chandra et al. | ............... | 716/106 |
| 6,609,230 B1 * | 8/2003 | Li | ................................. | 716/106 |
| 6,658,633 B2 * | 12/2003 | Devins et al. | ................. | 716/106 |
| 6,665,862 B2 * | 12/2003 | Isman | ........................... | 717/125 |
| 6,701,474 B2 * | 3/2004 | Cooke et al. | .................. | 714/724 |
| 6,708,306 B2 * | 3/2004 | Bartenstein et al. | .......... | 714/741 |
| 6,882,970 B1 * | 4/2005 | Garner et al. | .................. | 704/236 |
| 7,076,415 B1 * | 7/2006 | Demler et al. | ................... | 703/14 |
| 7,085,700 B2 * | 8/2006 | O'Riordan et al. | ........... | 717/125 |
| 7,096,446 B2 * | 8/2006 | Karniewicz | .................... | 716/124 |
| 7,434,184 B2 * | 10/2008 | Li | ................................. | 716/106 |
| 7,437,701 B1 * | 10/2008 | Dutra et al. | .................... | 716/104 |
| 7,496,895 B1 * | 2/2009 | Mosterman et al. | .......... | 717/126 |
| 7,523,445 B1 * | 4/2009 | Geller et al. | ................... | 717/126 |
| 7,581,202 B2 * | 8/2009 | Perez | ............................ | 716/119 |
| 7,631,289 B1 * | 12/2009 | Lei | ................................. | 716/51 |
| 7,752,515 B2 * | 7/2010 | Dervisoglu et al. | .......... | 714/728 |
| 7,853,926 B2 * | 12/2010 | Blouin et al. | .................. | 717/124 |
| 7,926,037 B2 * | 4/2011 | Leino et al. | .................... | 717/126 |
| 8,645,927 B2 * | 2/2014 | Rammel | ........................ | 717/135 |
| 2003/0149962 A1 * | 8/2003 | Willis et al. | .................... | 717/135 |

(Continued)

OTHER PUBLICATIONS

Kumar, et al., "A Test Structure Advisor and a Coupled, Library-Based Test Structure Layout and Testing Environment", 1997, IEEE; [retrieved on Dec. 4, 2012]; Retrieved from Internet <URL:http://ieeexplore.ieee.org/stamp/stamp.jsp?tp=&arnumber=618210>;pp. 370-383.*

(Continued)

*Primary Examiner* — Xi D Chen
(74) *Attorney, Agent, or Firm* — Park, Vaughan, Fleming & Dowler LLP; Chia-Hsin Suen

(57) ABSTRACT

Some embodiments provide a system that facilitates the evaluation of an equation. During operation, the system obtains one or more data-access functions to be used in the equation. Next, the system obtains an analysis context for the equation separately from the data-access functions. The analysis context may include one or more analysis parameters that specify one or more data sources and/or types of analysis to be used in evaluating the equation. Finally, the system evaluates the equation using the data-access functions and the data sources.

24 Claims, 5 Drawing Sheets

(56) References Cited

U.S. PATENT DOCUMENTS

| | | | |
|---|---|---|---|
| 2004/0015869 A1* | 1/2004 | Herriot et al. | 717/126 |
| 2004/0268320 A1* | 12/2004 | Huin et al. | 717/135 |
| 2007/0044078 A1* | 2/2007 | Cifra | 717/135 |
| 2007/0245318 A1* | 10/2007 | Goetz et al. | 717/135 |
| 2013/0290935 A1* | 10/2013 | Hosokawa et al. | 717/126 |

OTHER PUBLICATIONS

Apfelbaum., "Automated Functional Test Generation", 1995, IEEE; [retrieved on Dec. 4, 2012]; Retrieved from Internet <URL:http://ieeexplore.ieee.org/stamp/stamp.jsp?tp=&arnumber=522660>;pp. 101-107.*

Morales, et al., "Novel Methodology for Functional Modeling and Simulation of Wireless Embedded Systems"; 2008 EURASIP Journal on Embedded Systems; [retrieved on Jul. 3, 2014]; Retrieved from Internet <URL:http://dl.acm.org/citation.cfm?id=1463084>;pp. 1-9.*

Kornaros, Pnevmatikatos, "A Survey and Taxonomy of On-Chip Monitoring of Multicore Systems-on-Chip"; 2013 ACM; [retrieved on Jul. 3, 2014]; Retrieved from Internet <URL:http://dl.acm.org/citation.cfm?id=2442087>;pp. 17:1-17:38.*

Cottrell, Grebinski, "Ineroperability Beyond Design: Sharing Knowledge between Design and Manufacturing"; 2013 IEEE; [retrieved on Jul. 3, 2014]; Retrieved from Internet <URL:http://ieeexplore.ieee.org/stamp/stamp.jsp?tp=&arnumber=1194734>;pp. 1-6.*

Ozturk, et al., "Optimal Topology Exploration for Application-Specific 3D Architectures" [retrieved on Jul. 3, 2014]; Retrieved from Internet <URL:http://ieeexplore.ieee.org/stamp/stamp.jsp?tp=&arnumber=1594714>;pp. 390-395.*

* cited by examiner

CONTEXT-BASED EVALUATION OF EQUATIONS

FIELD

The present embodiments relate to techniques for evaluating equations. More specifically, the present embodiments relate to a method and system for context-based evaluation of equations.

BACKGROUND

Related Art

Electronic design automation (EDA) software is routinely used during circuit design and validation. After performing simulations, users of EDA software often post-process output waveforms using user-supplied equations, which are typically provided or specified using a user interface. For example, users may provide an equation through an EDA user interface by typing commands in a calculator-style equation editor using a user-interface device, such as a keyboard. Alternatively, users may select an equation by selecting graphical objects that are displayed in a graphical user interface (GUI), for example, in a so-called 'wizard-style' interface.

In addition, equations used by EDA applications frequently include information regarding the data sources and/or types of analysis to be used in the evaluation of the equations. For example, an equation may include a data-access function that evaluates the voltage of a set of simulation results for an integrated circuit design. The function may include an argument specifying the type of simulation analysis (e.g., transient, AC, DC, etc.) to be used, as well as an argument identifying a directory containing the simulation results.

However, the use of such equations may cause issues with readability and/or reusability. In particular, the inclusion of analysis and/or data source information in a data-access function may significantly increase the length and complexity of the function. As a result, an equation containing a large number of data-access functions, some of which may be nested, may be difficult to read and/or understand.

At the same time, use of the equation with other types of analysis and/or data sources may be unwieldy. For example, an equation may include four functions, each of which contains an argument specifying a type of analysis to be used and another argument specifying a directory containing data to be analyzed. The use of the same equation with a different set of simulation results and/or a different type of analysis may thus require the modification of up to eight arguments within the equation.

SUMMARY

Some embodiments provide a system that facilitates the evaluation of an equation by a software program. During operation, the system obtains one or more data-access functions to be used in the equation. Next, the system obtains an analysis context for the equation separately from the data-access functions. The analysis context may include one or more analysis parameters that specify one or more data sources and/or types of analysis to be used in evaluating the equation. Finally, the system evaluates the equation using the data-access functions and the data sources. In addition to specifying the data sources and/or the names or types of analysis, the analysis context can include information of the data's representation format, information of whether the data is in the time domain or frequency domain, hierarchy information of the signals that are being analyzed, filtering parameters (e.g., an analysis time window and/or an analysis frequency range) to narrow the scope of the data being analyzed, simulation/circuit parameters that were used to generate the data, and/or any other information that would be needed to evaluate the equation. Providing the entire analysis context separately from the equation improves readability, usability, and portability of the equation.

More specifically, the system may evaluate the equation by identifying the data sources from the analysis parameters and using data from the data sources as input to the data-access functions. For example, the system may locate a set of data files corresponding to the data sources using filenames and/or directories in the analysis parameters. The system may then process the contents of the data files using the data-access functions.

In some embodiments, the system also obtains a modified analysis context for the equation and re-evaluates the equation using the modified analysis context without modifying the equation. The analysis context and modified analysis context may be obtained through a graphical user interface (GUI) associated with the software program. For example, the GUI may include a context-selection mechanism containing graphical objects corresponding to analysis parameters. A user may add or remove analysis parameters from the analysis context by selecting and/or deselecting the corresponding graphical objects in the context-selection mechanism.

In some embodiments, the software program is an electronic design automation (EDA) application. Within the EDA application, the GUI may enable storage of the equation and the analysis context for use with different designs by the EDA application. In particular, the GUI may include a history mechanism that allows the user to store equations and the associated analysis contexts for future use. To use a stored equation, the user may select a graphical object corresponding to the equation within the history mechanism. The equation may be evaluated using the analysis context with which the equation was stored, or the equation may be evaluated using a different analysis context.

In some embodiments, each of the data sources corresponds to at least one of a data file, a solution set for an optimization technique, and a statistical sample for a simulation technique. For example, the data sources may include output files of simulation results for an integrated circuit design, solution sets used by optimization techniques (e.g., artificial neural networks, global search heuristics, evolutionary computation, etc.), and/or statistical samples used by simulation techniques (e.g., Monte Carlo methods, numerical analysis, etc.).

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Figure 1:
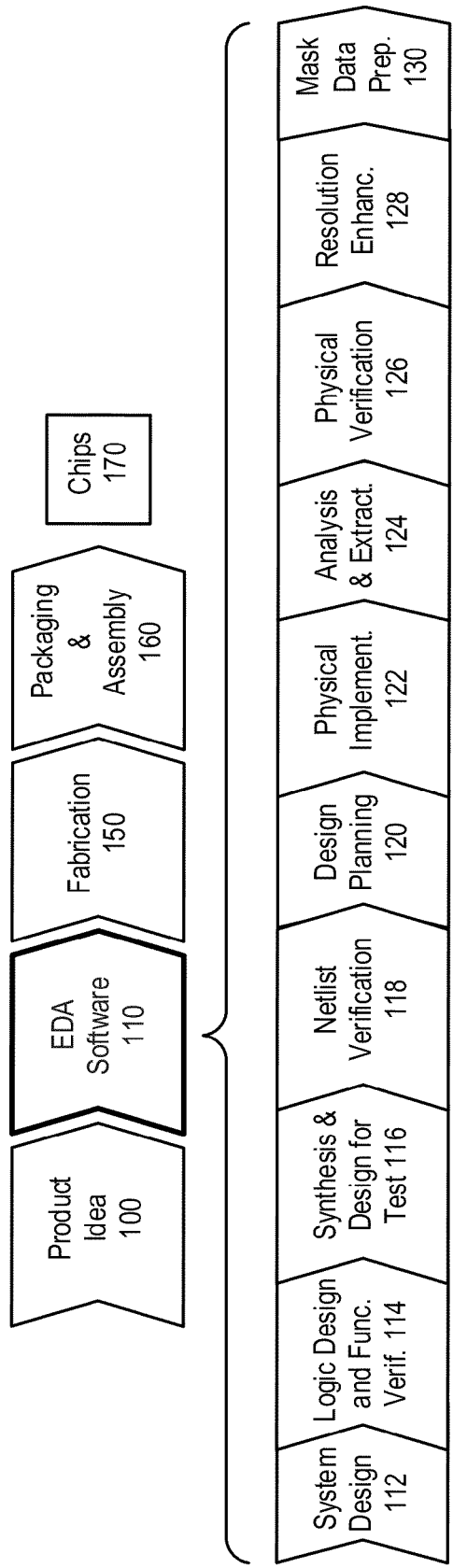
FIG. 1 shows a workflow associated with the design and fabrication of an integrated circuit in accordance with an embodiment.

FIG. 1 shows a workflow associated with the design and fabrication of an integrated circuit in accordance with an embodiment. The workflow may begin with a product idea (step 100), which may be realized using an integrated circuit that is designed using an electronic design automation (EDA) process (step 110). After the integrated circuit design is finalized, the design may undergo a fabrication process (step 150) and a packaging and assembly process (step 160) to produce chips 170.

The EDA process (step 110) includes steps 112-130, which are described below for illustrative purposes only and are not meant to limit the present invention. Specifically, the steps may be performed in a different sequence than the sequence described below.

During system design (step 112), circuit designers may describe the functionality to be implemented in the integrated circuit. They may also perform what-if planning to refine functionality, check costs, etc. Hardware-software architecture partitioning may also occur at this stage.

During logic design and functional verification (step 114), the Hardware Description Language (HDL) code for modules in the system may be written and the design may be checked for functional accuracy, (e.g., the design may be checked to ensure that it produces the correct outputs).

During synthesis and design for test (step 116), the HDL code may be translated to a netlist. Further, the netlist may be optimized for the target technology, and tests may be designed and implemented to check the finished chips.

During netlist verification (step 118), the netlist may be checked for compliance with timing constraints and for correspondence with the HDL code.

During design planning (step 120), an overall floorplan for the chip may be constructed and analyzed for timing and top-level routing. During physical implementation (step 122), circuit elements may be positioned in the layout (placement) and may be electrically coupled (routing).

During analysis and extraction (step 124), the circuit's functionality may be verified at a transistor level and parasitics may be extracted. During physical verification (step 126), the design may be checked to ensure correctness for manufacturing, electrical issues, lithographic issues, and circuitry.

During resolution enhancement (step 128), geometric manipulations may be performed on the layout to improve manufacturability of the design. During mask data preparation (step 130), the design may be "taped-out" to produce masks that are used during fabrication.

Embodiments of the present invention may be used in one or more of the above-described steps. Embodiments of the present invention have been described in this disclosure for illustrative purposes only. Specifically, though some illustrative examples are described in the context of an EDA application, embodiments of the present invention are not limited to EDA software. For example, embodiments of the present invention may be used in any software application or hardware apparatus that enables a user to iteratively process multiple sets of data with an equation.

Figure 2:
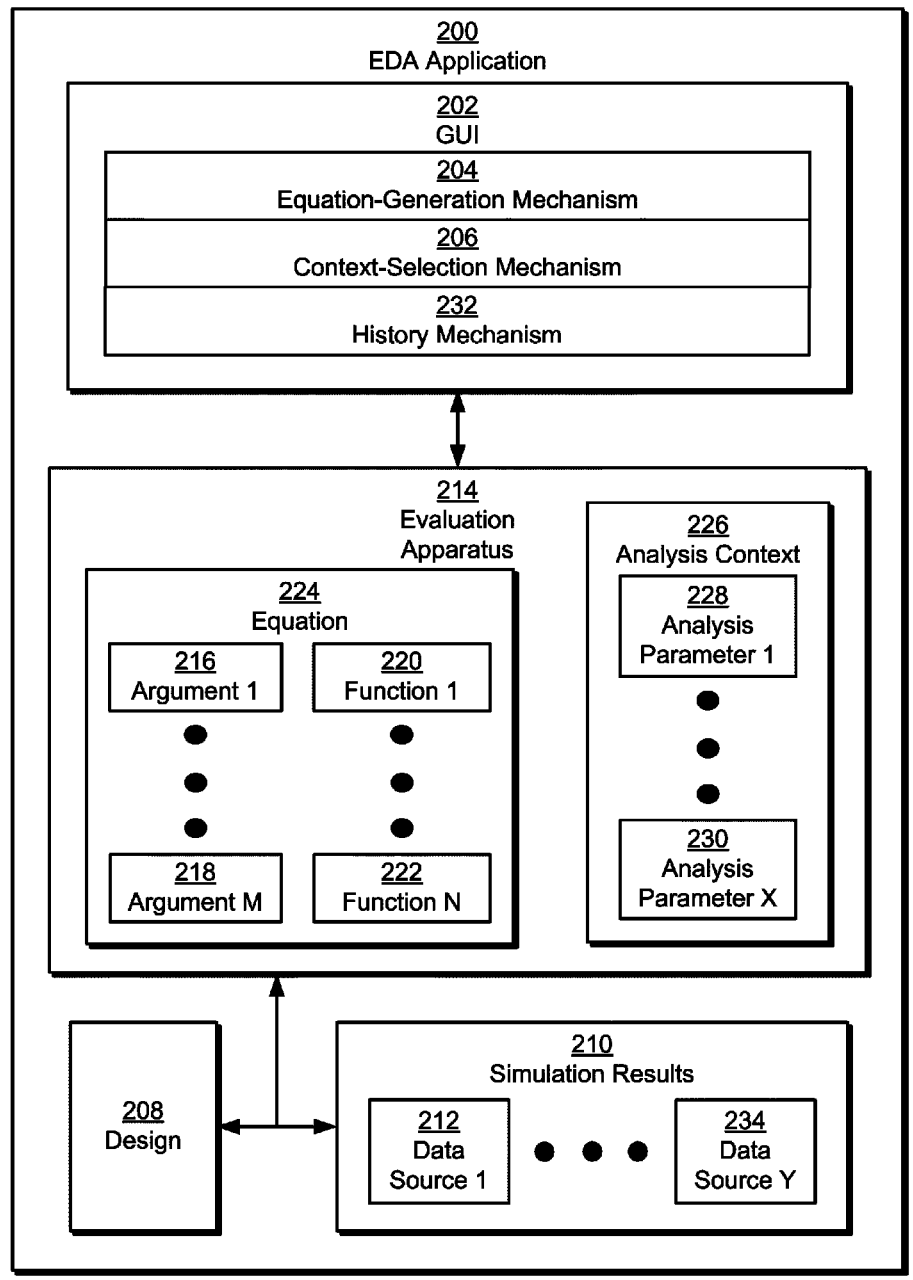
FIG. 2 shows an electronic design automation (EDA) application in accordance with an embodiment.

FIG. 2 shows an EDA application 200 in accordance with an embodiment. As shown in FIG. 2, EDA application 200 includes a graphical user interface (GUI) 202, a design 208, simulation results 210 for the design, and an evaluation apparatus 214. Each of these components is described in further detail below.

Design 208 may correspond to an abstract representation of an integrated circuit that uses graphical objects to represent components in the integrated circuit. Design 208 may contain symbols that represent resistors, capacitors, transistors, logic gates, and/or other components in the integrated circuit. The graphical objects may additionally be connected by lines that represent power and signal connections between the components. In other words, the functionality of the integrated circuit may be illustrated by the components and interconnections within design 208.

Design 208 may be created using EDA application 200. For example, EDA application 200 may correspond to a schematic and/or layout editor that allows a user to create design 208 on a computer system. Consequently, design 208 may correspond to a schematic and/or layout of the integrated circuit, with cells in design 208 representing components in the integrated circuit and nets in design 208 representing the interconnections.

EDA application 200 may also allow the user to simulate and/or verify design 208. In particular, EDA application 200 may include functionality to allow the user to test the correctness and/or performance of design 208 through transistor simulation, logic simulation, and/or behavioral simulation of design 208. For example, EDA application 200 may include an HSPICE (HSPICE™ is a registered trademark of Synopsys, Inc.) simulator, a CustomSim (CustomSim™ is a registered trademark of Synopsys, Inc.) simulator, Custom Designer Simulation and Analysis Environment, and/or a WaveView Analyzer from Synopsys, Inc. EDA application 200 may also store one or more sets of simulation results 210 created from simulations of design 208 in one or more data sources (e.g., data source 1 212, data source y 234) for subsequent use by the user. For example, EDA application 200 may save each set of simulation results in one or more data files within a directory associated with the simulation results.

The user may use the saved simulation results 210 to change and/or update design 208. For example, the user may use simulation results 210 to assess the behavior of the integrated circuit and modify design 208 if the assessed behavior is undesired. The user may also process simulation results 210 with an equation 224 to assist with the analysis of the integrated circuit's behavior. For example, equation 224 may include mathematical and/or signal processing functions to facilitate the visualization and/or analysis of simulation results 210 by the user.

In one or more embodiments, equation 224 is evaluated by evaluation apparatus 214. For example, evaluation apparatus 214 may process simulation results 210 using one or more functions in equation 224 and provide the output of the functions to the user in one or more graphical plots. The user may then update design 208 based on the plotted output.

In one or more embodiments, equation 224 is created using GUI 202. For example, GUI 202 may include an equation-generation mechanism 204 that displays a field containing equation 224 to the user and allows the user to add text corresponding to equation 224 using a keyboard, mouse, and/or other input device. In addition, the user may build equation 224 incrementally by adding a series of functions (e.g., function 1 220, function n 222) and arguments (e.g., argument 1 216, argument m 218) to equation 224. For example, the user may construct an equation containing three functions by adding a first function and two arguments to the first function, wrapping a second function around the first function (e.g., using the first function as the sole argument of the second function), and wrapping a third function around the second function and adding three additional arguments to the third function.

Functions in equation 224 may include arguments corresponding to cells, nets, and/or electrical parameters such as voltage, current, power, conductivity, frequency response, and/or other qualities associated with the behavior of the integrated circuit.

Some approaches for expressing and evaluating equations are not readable and/or portable. Specifically, the use of arguments to specify analysis and/or data source information may significantly increase the length of an equation and/or obscure the functionality of an equation. For example, a voltage function in an equation may include the following expression:

$$v(\text{out, analysis=ac, resultsDir=/home/simulations/data/PLL/results}).$$

In the above expression, the "out" argument may correspond to the name of a net, the "analysis=ac" argument may indicate AC analysis of simulation results, and "resultsDir=/home/simulations/data/PLL/results" may specify the data source (e.g., directory) containing the AC-analysis simulation results to be used in evaluating the function. In other words, the last two arguments of the function specify information that is independent of the core functionality of the equation. This type of arbitrary commingling of extrinsic information with the core functionality of the equation is undesirable because it can reduce the readability and/or portability of the equation.

Approaches that encode the name of a data-access function into the equation are even worse in terms of readability and portability. For example, in some approaches, the evaluation of the voltage function with AC analysis may be specified with a function name of "vac," the evaluation of the voltage function with DC analysis may be specified with a function name of "vdc," and the evaluation of the function with transient analysis may be specified with a function name of "vtran." These approaches result in equations that are not readable and/or portable. For example, in these approaches, a user may not know that the text "ac" when appended to the letter "v" indicates that the voltage values are being retrieved from the AC-analysis file.

If analysis context is encoded into function names, a large number of function names may need to be generated to identify all possible combinations of data-access functions and analysis contexts. This may be difficult to support in an EDA application. Further, a user may find it very difficult to keep track of the various function names.

Furthermore, encoding the analysis context into function names can severely reduce portability. For example, an equation may contain the following text:

$$\text{vac(out)}-\text{vac(in)}+\text{vac(net2)}-\text{vac(net3)}$$

In other words, the equation may contain four data-access functions named "vac" that specify an analysis context of AC analysis within the function name. As a result, all four data-access functions must be changed to "vtran" to change the analysis context of the equation to transient analysis.

Some embodiments of the present invention overcome the above-described drawbacks by separating the evaluation context of an equation from the core functionality of the equation. Specifically, to increase the readability and/or reusability of equation 224, GUI 202 may include functionality to obtain analysis context 226 separately from functions and/or arguments in equation 224. As mentioned previously, equation-generation mechanism 204 may include a field that allows the user to provide input associated with the creation and/or modification of equation 224. Equation-generation mechanism 204 may also display a set of graphical objects representing functions for use in equation 224 and/or a list of hyperlinks to the functions. To add functions to equation 224, the user may select the graphical objects and/or hyperlinks using a mouse, keyboard, and/or other input device. Similarly, equation-generation mechanism 204 may allow the user to select graphical objects representing cell instances, terminals, and/or nets as arguments to the functions. Alternatively, equation-generation mechanism 204 may allow the user to input functions and/or arguments into equation 224 using keyboard shortcuts, voice commands, and/or other input methods.

During the creation of equation 224, the user may interact with a context-selection mechanism 206 in GUI 202 to specify one or more analysis parameters (e.g., analysis parameter 1 228, analysis parameter x 230) associated with analysis context 226. Each analysis parameter may specify a data source and/or type of analysis to be used in evaluating equation 224. In addition, context-selection mechanism 206 may allow the user to add analysis parameters to analysis context 226 by selecting graphical objects and/or hyperlinks representing data sources and/or types of analysis within GUI 202. For example, the user may highlight one or more data-access functions within equation-generation mechanism 204 to establish a focus on the data access function(s). The user may then select a graphical object corresponding to an analysis parameter within context-selection mechanism 206 to add the analysis parameter to analysis context 226. Furthermore, the focus on the data-access function(s) may indicate that the analysis parameter is only applicable to the highlighted data-access function(s).

In one or more embodiments, the appearance of equation 224 in equation-generation mechanism 204 is unaffected by the user's creation of analysis context 226 through context-selection mechanism 206. As a result, the user may modify analysis context 226 using context-selection mechanism 206, and evaluation apparatus 214 may re-evaluate equation 224 using the modified analysis context without requiring the user to modify equation 224. For example, the user may use equation 224 to process simulation results for a different design by using context-selection mechanism 206 to select a new set of analysis parameters corresponding to data sources for the simulation results. The user may then use evaluation apparatus 214 to re-evaluate equation 224 using the new analysis parameters without modifying the text within equation 224.

Furthermore, a history mechanism 232 in GUI 202 may enable storage of equation 224 and analysis context 226 for use with different designs by EDA application 200. In particular, the user may interact with history mechanism 232 to save equation 224 and analysis context 226 for future use, or equation 224 and analysis context 226 may automatically be saved by history mechanism 232 after equation 224 is evaluated using analysis context 226. To use equation 224 and analysis context 226 with another design, the user may select a graphical object corresponding to equation 224 and analysis context 226 in history mechanism 232 while the other design is opened within EDA application 200.

The user may also omit interaction with history mechanism 232 and use equation 224 with the other design by copying and pasting equation 224 into a part of GUI 202 (e.g., an equation-generation mechanism) associated with the other design. If the other design is associated with a different analysis context (e.g., as specified in a context-selection mechanism for the other design), equation 224 may be modified to maintain analysis context 226 during evaluation. For example, analysis parameters in analysis context 226 may be added as arguments to functions in equation 224 to ensure that equation 224 is evaluated by evaluation apparatus 214 using analysis context 226 instead of the analysis context of the other design. Conversely, equation 224 may be evaluated without modification if the user specifies that analysis context 226 not be maintained during evaluation of equation 224 with other designs.

Those skilled in the art will appreciate that equations and analysis contexts may be used in a variety of domains. Consequently, the functionality of GUI 202 and evaluation apparatus 214 may be applicable to other software and/or hardware environments, such as numerical computing environments, computational software, simulation environments, graphing calculators and software, formula editors, and/or data analysis software. For example, data sources associated with the analysis context of an equation may include data files, solution sets used by optimization techniques (e.g., artificial neural networks, global search heuristics, evolutionary computation, etc.), and/or statistical samples used by simulation techniques (e.g., Monte Carlo methods, numerical analysis, etc.).

Figure 3:
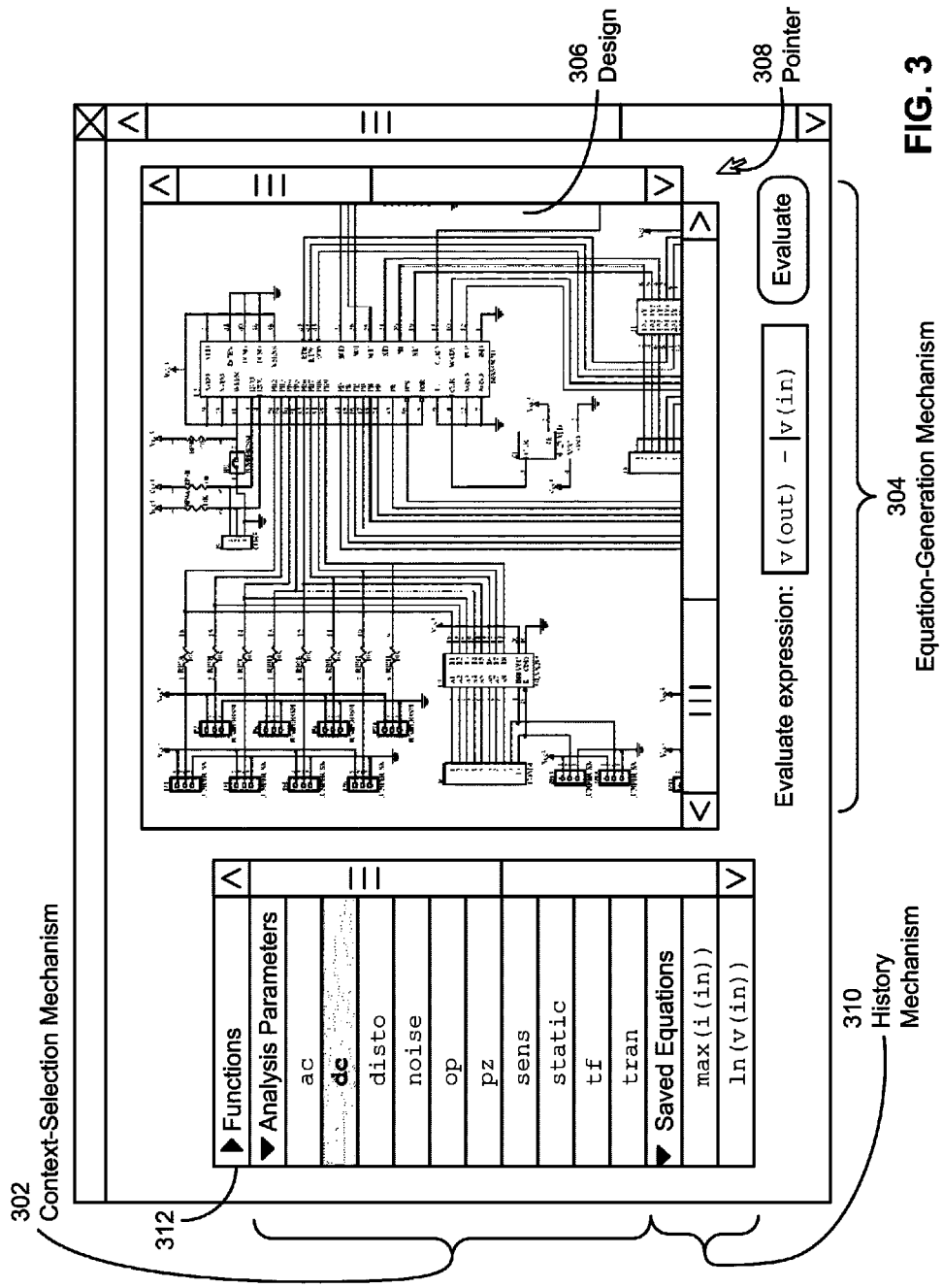
FIG. 3 shows an exemplary screenshot in accordance with an embodiment.

FIG. 3 shows an exemplary screenshot in accordance with an embodiment. More specifically, FIG. 3 shows a screenshot of a GUI for an EDA application, such as GUI 202 of FIG. 2. The GUI of FIG. 3 may allow a user of the EDA application to create an equation, such as equation 224 of FIG. 2. The equation may be used during the creation of a design 306, which is displayed within the GUI. For example, the equation may be used to process the results of one or more simulations of design 306.

To create the equation, the user may interact with an equation-generation mechanism 304. As shown in FIG. 3, equation-generation mechanism 304 displays a field containing an expression (e.g., "v(out)−v(in)") corresponding to the equation, with a cursor positioned before the "v(in)" in the expression. In addition, the position of the cursor may establish a focus on the "v(in)" function within the equation. As discussed in further detail below, the focus on one or more functions within the equation may allow the user to fully specify an analysis context for the equation.

Within the expression, "out" and "in" may correspond to arguments of the first and second "v" (e.g., voltage) functions, respectively. Equation-generation mechanism 304 may allow the user to edit the equation directly within the field. For example, the user may modify the equation by typing on the keyboard, using keyboard shortcuts, and/or copying and pasting text using a pointer 308. Alternatively, the user may select a drop-down element 312 (e.g., "Functions") to view a drop-down list of functions that are available in the EDA application. For example, the user may expand drop-down element 312 to view data-access functions related to voltage analysis, current analysis, power analysis, and/or other types of analysis of simulation results for design 306.

Functions shown under drop-down element 312 may also include mathematical and/or signal-processing functions, such as functions for evaluating logarithms, absolute values, and/or maximum values, as well as functions for performing Fourier analysis, filtering, digitization, and/or feature extraction. The user may add a function to the equation by selecting the area of the drop-down list corresponding to the function. For example, the user may insert the "v" function into the equation by clicking on element 312 to expand the drop-down list, then clicking on an element labeled "v" in the list.

The user may also provide an analysis context for the equation. The analysis context may include one or more analysis parameters, with each analysis parameter specifying a data source and/or type of analysis to be used in evaluating the equation. The user may add the analysis parameters as arguments to one or more data-access functions in the equation. For example, the user may specify two data sources to be used in evaluating the equation by modifying the equation to read "v(out, resultsDir=dir1)−v(in, resultsDir=dir2)." However, as discussed above, the inclusion of the analysis context in the equation may detract from the readability and/or portability of the equation. For example, the user may be required to modify the second arguments of both voltage functions to use the equation with a different design and/or set of simulation results.

On the other hand, the user may interact with a context-selection mechanism 302 within the GUI to specify analysis parameters for the equation separately from the expression in equation-generation mechanism 304. As with drop-down element 312, the user may select a drop-down element (e.g., "Analysis Parameters") in context-selection mechanism 302 to view a drop-down list of analysis parameters for data-access functions. As shown in FIG. 3, the drop-down list is expanded and includes a set of analysis types. Each analysis type may allow a data-access function to process a specific set of simulation results by indicating a data file containing the simulation results. For example, a data-access function that is evaluated with the "ac" analysis parameter may only process output files of simulation results for design 208 that end in ".ac0."

In addition, the drop-down list includes a highlighted element (e.g., "dc"). The highlighted element may indicate that the "dc" analysis parameter is selected for use with the data-access function on which a focus is established (e.g., "v(in)"). To specify a different analysis parameter for the "v(in)" function, the user may select an element in the drop-down list corresponding to the analysis parameter. For example, the user may select the "tran" element within context-selection mechanism 302 to change the analysis parameter associated with the "v(in)" function to transient analysis. Context-selection mechanism 302 may reflect the change by un-highlighting the element corresponding to the "dc" analysis parameter and highlighting the element corresponding to the "tran" analysis parameter.

To specify and/or change the analysis parameter for the "v(out)" function, the user may establish a focus on the "v(out)" function by moving the cursor in equation-generation mechanism 304 until the cursor is adjacent to and/or within the text for the "v(out)" function. Alternatively, the user may select some or all of the text for the "v(out)" function with pointer 308 and/or a keystroke combination on the keyboard. Along the same lines, the user may select all of the text in the expression to establish a focus on the entire equation.

Context-selection mechanism 302 may respond to the change in focus by un-highlighting the element corresponding to the "dc" analysis parameter if the "dc" analysis parameter is not associated with the new function(s) on which the focus is established. If a different analysis parameter is selected for use with the function(s), context-selection mechanism 302 may highlight the element corresponding to the analysis parameter. The user may specify a new analysis parameter for the function(s) by selecting the element corresponding to the new analysis parameter. For example, the user may select the "ac" element in context-selection mechanism 302 while the "v(out)" function is highlighted to specify an AC analysis parameter for use with the "V(out)" function.

The user may also interact with a history mechanism 310 in the GUI to reuse equations with different designs and/or simulation results. In particular, the user may select a drop-down element (e.g., "Saved Equations") in history mechanism 310 to view a drop-down list of equations created and/or saved by the user. The user may then select an element within the drop-down list to trigger the evaluation of the equation corresponding to the element. For example, the user may select the "max(i(in))" element in history mechanism 310 to evaluate the corresponding equation using simulation results from design 306. The equation may appear in equation-generation mechanism 304 for modification by the user prior to evaluation, or the equation may automatically be evaluated upon selection by the user.

In addition, equations in history mechanism 310 may be evaluated using the equations' original analysis contexts. For example, the "max(i(in))" equation in history mechanism 310 may be created for use with the "tran" analysis parameter. If the user selects the "max(i(in))" equation for use with design 306, the "tran" analysis parameter may continue to be used in evaluating the equation instead of the currently highlighted "dc" analysis parameter. To maintain the equation's analysis context, the equation may be automatically modified within equation-generation mechanism 304 to specify use of the "tran" analysis parameter (e.g., "max(i(in, analysis=tran))"). Alternatively, context-selection mechanism 302 may be updated with the "tran" analysis parameter highlighted instead of the "dc" analysis parameter.

On the other hand, the user may prefer that the equation be evaluated using the analysis context that is currently set in context-selection mechanism 302. For example, the user may right-click on the "max(i(in))" element to specify evaluation of the "max(i(in))" equation using the current analysis context in context-selection mechanism 302. The "max(i(in))" equation may thus be evaluated with the "dc" analysis parameter instead of the analysis parameter with which the equation was originally evaluated.

Figure 4:
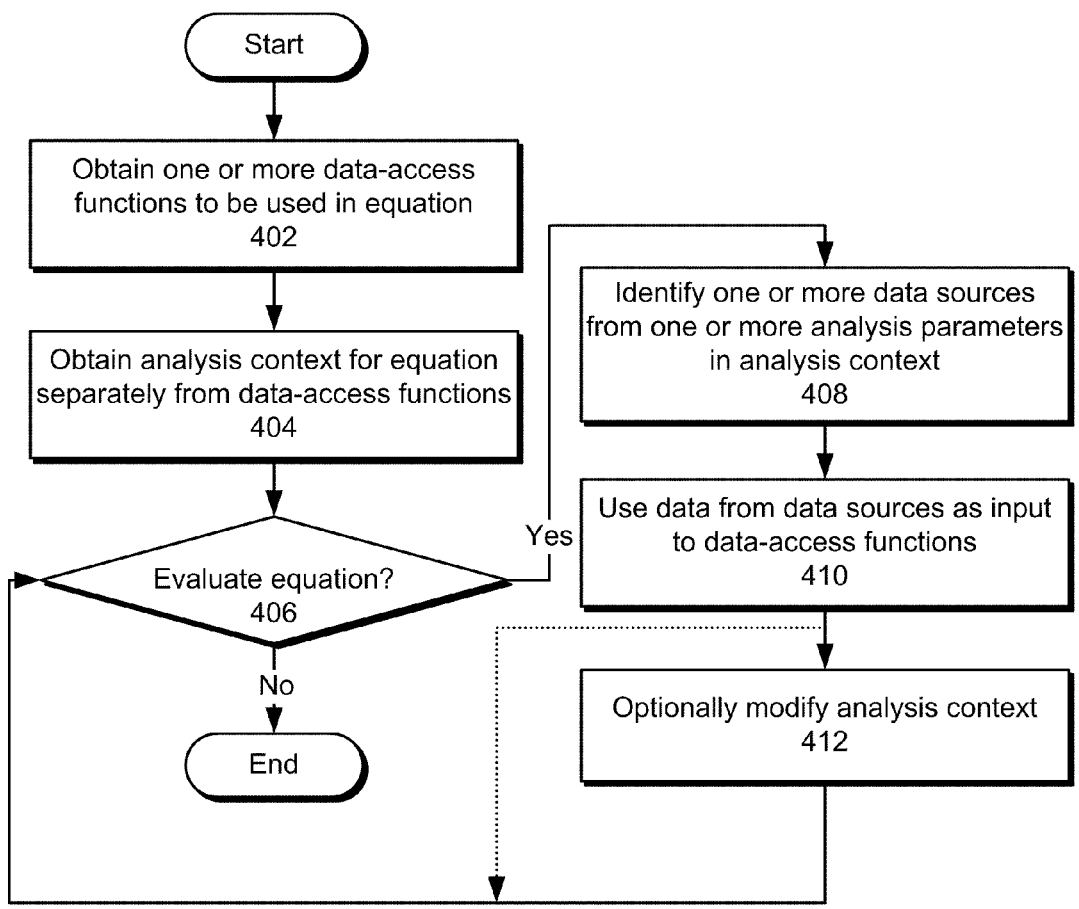
FIG. 4 shows a flowchart illustrating the process of facilitating the evaluation of an equation by a software program in accordance with an embodiment.

FIG. 4 shows a flowchart illustrating the process of facilitating the evaluation of an equation by a software program in accordance with an embodiment. In one or more embodiments, one or more of the steps may be omitted, repeated, and/or performed in a different order. Accordingly, the specific arrangement of steps shown in FIG. 4 should not be construed as limiting the scope of the embodiments.

First, one or more data-access functions to be used in the equation are obtained (operation 402). The data-access functions may be used by an EDA application to perform voltage, current, power, and/or other analyses of simulation results for integrated circuit designs. The data-access functions may also be used in Monte Carlo simulations, numerical analysis, evolutionary computation, optimization techniques, and/or other operations that utilize data sets as input.

Next, an analysis context for the equation is obtained separately from the data-access functions (operation 404). The analysis context may identify the data sets and/or types of analysis to be used by the data-access functions. In addition to specifying the data sources and/or the names or types of analysis, the analysis context can include, without limitation, the hierarchy information of signals whose values are stored in the one or more data sources, filtering parameters (e.g., an analysis time window and/or an analysis frequency range) to narrow the scope of the data being analyzed, the mathematical domain associated with the data (e.g., whether the data is in time domain or frequency domain), the analysis data's representation format in which the data is encoded (e.g., integer, fixed- or floating-point notation, decimal, binary, hexadecimal or binary-coded decimal representation, real or complex numbers), and/or simulation and circuit parameters which were used to generate the data stored in the one or more data sources.

For example, the analysis context may be used to identify an output file containing simulation results for an integrated circuit design, a set of sampled inputs for a Monte Carlo simulation, a set of weights for an artificial neural network, and/or a population of candidate solutions for an evolutionary computation technique. Note that the analysis context can be specified at an arbitrary level of granularity. For example, the user can create an analysis context which includes only the first 10 Monte Carlo simulation runs.

The equation may then be evaluated (operation 406) using the data-access functions and one or more analysis parameters in the analysis context. Each analysis parameter may specify a data source and/or type of analysis to be used in evaluating the equation. In addition, the analysis parameter may be associated with one or more of the data-access functions. For example, an analysis context for an equation with three data-access functions may have only two analysis parameters; the first analysis parameter may be associated with the first two data-access functions, while the second analysis parameter may be associated with the third data-access function.

If the equation is not to be evaluated, the equation is no longer used and/or processed. If the equation is to be evaluated, one or more data sources are identified from the analysis parameters (operation 408). For example, the data sources may be identified by directories and/or file names specified by the analysis parameters. Next, data from the data sources is used as input to the data-access functions (operation 410). In other words, the separation of the analysis context from the equation may allow the data sources to be identified and used in evaluating the equation without the readability and/or portability issues associated with including the analysis parameters in the equation.

The analysis context may be modified (operation 412). For example, the analysis context may be modified to include a different set of data sources for use with the equation. If the analysis context is modified, the modified analysis context can be used to re-evaluate the equation using the modified analysis context. Re-evaluating the equation does not require modifying the equation. The system identifies one or more data sources from one or more analysis parameters in the modified analysis context (operation 408) and uses data from the data sources as input to the data-access functions (operation 410). If the analysis context is not modified, the process can move directly from operation 410 to operation 406 (shown using a dotted line).

Modifications to the analysis context may continue to be obtained (operation 412) and used to evaluate the equation (operations 406-410) until the equation is no longer used to process data. For example, the equation may continue to be used by an EDA application for evaluation with different designs and/or sets of simulation results until the functionality of the equation is no longer needed. Along the same lines, the equation may be used with different sets of inputs for a Monte Carlo simulation until the simulation is complete.

Figure 5:
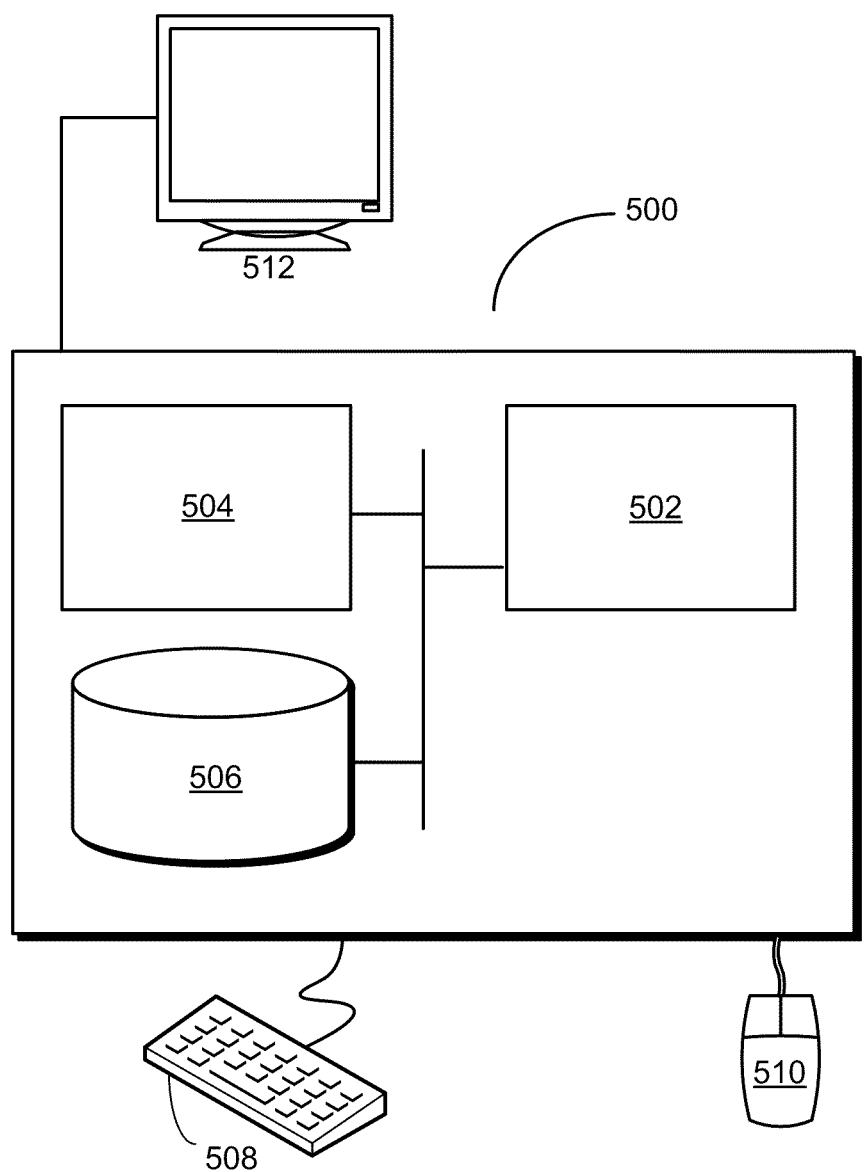
FIG. 5 shows a computer system in accordance with an embodiment.

FIG. 5 shows a computer system 500 in accordance with an embodiment. A computer or computer system can generally be any system that can perform computations. Specifically, a computer can be a microprocessor-based system which may include multiple processing cores, a network-processor-based system, a digital-signal-processor-based system, a portable computing device, a personal organizer, a distributed-computing-platform-based system, or any other computing system now known or later developed. Computer system 500 includes a processor 502, memory 504, storage 506, and/or other components found in electronic computing devices. Processor 502 may support parallel processing and/or multi-threaded operation with other processors in computer system 500. Computer system 500 may also include input/output (I/O) devices such as a keyboard 508, a mouse 510, and a display 512.

Computer system 500 may include functionality to execute various components of the present embodiments. In particular, computer system 500 may include an operating system (not shown) that coordinates the use of hardware and software resources on computer system 500, as well as one or more applications that perform specialized tasks for the user. To perform tasks for the user, applications may obtain the use of hardware resources on computer system 500 from the operating system, as well as interact with the user through a hardware and/or software framework provided by the operating system.

In one or more embodiments, computer system 500 provides a system for facilitating the evaluation of an equation. The equation may be used in a software program such as an EDA application. The system may include a GUI that obtains one or more data-access functions to be used in the equation and obtains an analysis context for the equation separately from the data-access functions. The system may also include an evaluation apparatus that evaluates the equation using the data-access functions and one or more data sources associated with the analysis context. To evaluate the equation, the evaluation apparatus may identify the data sources from one or more analysis parameters in the analysis context and use data from the data sources as input to the data-access functions. The GUI may also enable storage of the equation and the analysis context for use with different designs by the EDA application.

In addition, one or more components of computer system 500 may be remotely located and connected to the other components over a network. Portions of the present embodiments (e.g., GUI, evaluation apparatus, etc.) may also be located on different nodes of a distributed system that implements the embodiments. For example, the present embodiments may be implemented using a cloud computing system that enables the creation of designs on a remote EDA application.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for facilitating the evaluation of an equation that is used during circuit design or validation by a software program, comprising:
   obtaining one or more data-access functions to be used in the equation, wherein the one or more data-access functions access data from one or more data sources based on an analysis context;
   obtaining the analysis context for the equation separately from the data-access functions, wherein the analysis context includes at least one of: information of whether the data that is to be used to evaluate the equation is in time domain or frequency domain, an analysis time window to select the data that is to be used to evaluate the equation, or an analysis frequency range to select the data that is to be used to evaluate the equation; and
   using a computer to evaluate the equation by using the data-access functions.

2. The computer-implemented method of claim 1, wherein evaluating the equation using the data-access functions and the one or more data sources associated with the analysis context involves:
   using the analysis context to identify analysis data from the data sources, wherein the analysis context includes at least one of: an analysis name or analysis type; and
   using the analysis data from the data sources as input to the data-access functions.

3. The computer-implemented method of claim 2, wherein the analysis context further includes at least one of:
   information of the analysis data's representation format; or
   simulation and circuit parameters which were used to generate the analysis data.

4. The computer-implemented method of claim 1, further comprising:
   obtaining a modified analysis context for the equation; and
   re-evaluating the equation using the modified analysis context without modifying the equation.

5. The computer-implemented method of claim 4, wherein the analysis context and the modified analysis context are obtained through a graphical user interface (GUI) associated with the software program.

6. The computer-implemented method of claim 5,
   wherein the software program is an electronic design automation (EDA) application, and
   wherein the GUI enables storage of the equation and the analysis context for use with different designs by the EDA application.

7. The computer-implemented method of claim 1, wherein each of the data sources corresponds to at least one of a data file, a solution set for an optimization technique, and a statistical sample for a simulation technique.

8. A system for facilitating the evaluation of an equation that is used during circuit design or validation by a software program, comprising:

a processor;
a memory;
a graphical user interface (GUI) configured to:
  obtain one or more data-access functions to be used in the equation, wherein the one or more data-access functions access data from one or more data sources based on an analysis context; and
  obtain the analysis context for the equation separately from the data-access functions, wherein the analysis context includes at least one of: information of whether data from the one or more data sources that is to be used to evaluate the equation is in time domain or frequency domain, an analysis time window to select the data from the one or more data sources that is to be used to evaluate the equation, or an analysis frequency range to select the data from the one or more data sources that is to be used to evaluate the equation; and
an evaluation apparatus configured to evaluate the equation by using the data-access functions.

9. The system of claim 8, wherein evaluating the equation using the data-access functions and the one or more data sources associated with the analysis context involves:
  using the analysis context to identify analysis data from the data sources, wherein the analysis context includes at least one of: an analysis name or analysis type; and
  using the analysis data from the data sources as input to the data-access functions.

10. The system of claim 9, wherein the analysis context further includes at least one of:
  information of the analysis data's representation format; or
  simulation and circuit parameters which were used to generate the analysis data.

11. The system of claim 8,
  wherein the GUI is further configured to obtain a modified analysis context for the equation, and
  wherein the evaluation apparatus is further configured to re-evaluate the equation using the modified analysis context without modifying the equation.

12. The system of claim 8,
  wherein the software program is an electronic design automation (EDA) application, and
  wherein the GUI further enables storage of the equation and the analysis context for use with different designs by the EDA application.

13. The system of claim 8, wherein each of the data sources corresponds to at least one of a data file, a solution set for an optimization technique, and a statistical sample for a simulation technique.

14. The system of claim 8, wherein the analysis context is obtained using at least one of a GUI element and a keyboard shortcut.

15. A non-transitory computer-readable storage medium storing instructions that when executed by a computer cause the computer to perform a method for facilitating the evaluation of an equation that is used during circuit design or validation by a software program, the method comprising:
  obtaining one or more data-access functions to be used in the equation, wherein the one or more data-access functions access data from one or more data sources based on an analysis context;
  obtaining the analysis context for the equation separately from the data-access functions, wherein the analysis context includes at least one of: information of whether the data from the one or more data sources that is to be used to evaluate the equation is in time domain or frequency domain, an analysis time window to select the data from the one or more data sources that is to be used to evaluate the equation, or an analysis frequency range to select the data from the one or more data sources that is to be used to evaluate the equation; and
  evaluating the equation using the data-access.

16. The non-transitory computer-readable storage medium of claim 15, wherein evaluating the equation using the data-access functions and the one or more data sources associated with the analysis context involves:
  using the analysis context to identify analysis data from the data sources, wherein the analysis context includes at least one of: an analysis name or analysis type; and
  using the analysis data from the data sources as input to the data-access functions.

17. The non-transitory computer-readable storage medium of claim 16, wherein the analysis context further includes at least one of:
  information of the analysis data's representation format; or
  simulation and circuit parameters which were used to generate the analysis data.

18. The non-transitory computer-readable storage medium of claim 15, the method further comprising:
  obtaining a modified analysis context for the equation; and
  re-evaluating the equation using the modified analysis context without modifying the equation.

19. The non-transitory computer-readable storage medium of claim 18, wherein the analysis context and the modified analysis context are obtained through a graphical user interface (GUI) associated with the software program.

20. The non-transitory computer-readable storage medium of claim 19,
  wherein the software program is an electronic design automation (EDA) application, and
  wherein the GUI enables storage of the equation and the analysis context for use with different designs by the EDA application.

21. The non-transitory computer-readable storage medium of claim 15, wherein each of the data sources corresponds to at least one of a data file, a solution set for an optimization technique, and a statistical sample for a simulation technique.

22. A graphical user interface (GUI) for facilitating the evaluation of an equation that is used during circuit design or validation by a software program, comprising:
  a display;
  an equation-generation mechanism configured to obtain one or more data-access functions to be used in the equation, wherein the one or more data-access functions access data from one or more data sources based on an analysis context; and
  a context-selection mechanism configured to obtain an analysis context for the equation separately from the data-access functions, wherein the equation is evaluated by the software program by using the data-access functions, and wherein the analysis context includes at least one of: information of whether the data that is to be used to evaluate the equation is in time domain or frequency domain, an analysis time window to select the data that is to be used to evaluate the equation, or an analysis frequency range to select the data that is to be used to evaluate the equation.

23. The GUI of claim 22, wherein the software program is an electronic design automation (EDA) application.

24. The GUI of claim 23, further comprising:
  a history mechanism configured to enable storage of the equation and the analysis context for use with different designs by the EDA application.

* * * * *